(12) United States Patent
Kocon

(10) Patent No.: US 8,143,679 B2
(45) Date of Patent: Mar. 27, 2012

(54) TERMINATION STRUCTURE FOR POWER DEVICES

(75) Inventor: Christopher Boguslaw Kocon, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 465 days.

(21) Appl. No.: 12/480,176

(22) Filed: Jun. 8, 2009

(65) Prior Publication Data

US 2009/0242978 A1  Oct. 1, 2009

Related U.S. Application Data

(62) Division of application No. 11/317,653, filed on Dec. 22, 2005, now Pat. No. 7,560,787.

(51) Int. Cl.
*H01L 29/08* (2006.01)
*H01L 29/38* (2006.01)
*H01L 21/00* (2006.01)

(52) U.S. Cl. ........ 257/409; 257/487; 257/488; 257/495; 257/496; 257/620; 257/E29.006; 257/E29.009; 438/454; 438/462

(58) Field of Classification Search .......... 257/409, 257/487, 488, 495, 496, E29.006, E29.009; 438/454, 462
See application file for complete search history.

(56) References Cited

U.S. PATENT DOCUMENTS

2002/0185680 A1   12/2002   Henninger et al.
2004/0056302 A1   3/2004   Grebs et al.

OTHER PUBLICATIONS

Chinese Office Action for Application No. 200680048523.7, dated Mar. 11, 2010, 35 pages, including English Translation.

*Primary Examiner* — Evan Pert

(74) *Attorney, Agent, or Firm* — Kilpatrick Townsend & Stockton LLP

(57) ABSTRACT

A semiconductor power device includes an active region configured to conduct current when the semiconductor device is biased in a conducting state, and a termination region along a periphery of the active region. The termination region includes a first silicon region of a first conductivity type extending to a first depth within a second silicon region of a second conductivity type, the first and second silicon regions forming a PN junction therebetween. The second silicon region has a recessed portion extending below the first depth and out to an edge of a die housing the semiconductor power device. The recessed portion forms a vertical wall at which the first silicon region terminates. A first conductive electrode extends into the recessed portion and is insulated from the second silicon region.

26 Claims, 6 Drawing Sheets

TERMINATION STRUCTURE FOR POWER DEVICES

CROSS-REFERENCE TO RELATED APPLICATIONS

This application is a division of U.S. application Ser. No. 11/317,653, filed Dec. 22, 2005, which is incorporated herein by reference in its entirety for all purposes.

U.S. application Ser. No. 11/026,276, filed Dec. 29, 2004 is incorporated herein by reference in its entirety for all purposes.

BACKGROUND

There continues to be a growing demand for semiconductor power switching devices, i.e., devices capable of carrying large currents at high voltages. Such devices include bipolar and field effect transistors including, for example, the Insulated Gate Bipolar transistor (IGBT) and the Metal Oxide Semiconductor Field Effect Transistor (MOSFET). Notwithstanding significant advances in power device technologies, there remains a need for still higher-performing and more cost-efficient devices. For example, it is desirable to further increase current density relative to the total die area of a device. One of the limiting factors to higher current ratings is the breakdown voltage, particularly in the edge termination region. Because semiconductor junctions include curvatures, various techniques are employed to avoid otherwise high concentrations of electric field lines. It is conventional in power device design to incorporate edge termination structures along the outer periphery of the device in order to ensure that the breakdown voltage in this region of the device is not any lower than the active region of the device.

Three examples of conventional termination structures are shown in FIGS. 1A-1C. FIG. 1A shows a simplified cross-section view of a termination region with multiple floating P-type rings 108. P-type diffusion region 106 represents the last blocking diffusion of the active region. P-type floating rings 108 help achieve a higher breakdown voltage in the periphery region by spreading the electric fields in a uniform manner. In FIG. 1B, a planar field plate 112 is electrically tied to the last blocking diffusion region 106 of the active region, and thus is biased to the same potential. Similar to P-type rings 108 in FIG. 1A, field plate 112 improves the periphery breakdown voltage by uniformly spreading the fields. An even higher periphery breakdown voltage is obtained by combining the techniques in FIGS. 1A and 1B as shown in FIG. 1C. In FIG. 1C, floating P-type rings 108 are combined with planar field plates 112 to achieve an even more uniform spreading of the electric fields in the termination region.

However, diffusion rings and planar field plates occupy relatively large areas of the die and require additional masking and processing steps, thus resulting in increased cost. Accordingly, there is a need for cost-effective termination techniques whereby a high breakdown voltage is achieved with minimal or no increase in process complexity and minimal silicon area consumption.

BRIEF SUMMARY OF THE INVENTION

In accordance with an embodiment of the invention, a semiconductor power device includes an active region configured to conduct current when the semiconductor device is biased in a conducting state, and a termination region along a periphery of the active region. A first silicon region of a first conductivity type extends to a first depth within a second silicon region of a second conductivity type, the first and second silicon regions forming a PN junction therebetween. At least one termination trench is formed in the termination. The termination trench extends into the second silicon region, and is laterally spaced from the first silicon region. An insulating layer lines the sidewalls and bottom of the termination trench. A conductive electrode at least partially fills the termination trench.

In one embodiment, the conductive electrode completely fills the termination trench and extends out of the termination trench to electrically contact a surface of the second silicon region.

In another embodiment, the conductive electrode is recessed in the termination trench and is fully insulated from the second silicon region, and an interconnect layer electrically connects the conductive electrode to the first silicon region.

In accordance with another embodiment of the invention, a semiconductor power device includes an active region configured to conduct current when the semiconductor device is biased in a conducting state, and a termination region along a periphery of the active region. A first silicon region of a first conductivity type extends to a first depth within a second silicon region of a second conductivity type, the first and second silicon regions forming a PN junction therebetween. The second silicon region has a recessed portion extending below the first depth and out to an edge of a die housing the semiconductor power device. The recessed portion forming a vertical wall at which the first silicon region terminates. A first conductive electrode extends into the recessed portion and being insulated from the second silicon region.

In one embodiment, the first conductive electrode extends out of the recessed portion to directly contact a surface of the first silicon region.

In another embodiment, the first conductive electrode is fully insulated from both the first and second silicon regions by an insulating layer, and an interconnect layer electrically connects the first conductive electrode to the first silicon region.

In another embodiment, a termination trench is formed in the termination region, such that the termination trench extends into the first silicon region, and is laterally spaced from the vertical wall. An insulating layer lines the sidewalls and bottom of the termination trench, and a second conductive electrode at least partially fills the termination trench.

In accordance with yet another embodiment of the invention, a semiconductor power device includes an active region configured to conduct current when the semiconductor device is biased in a conducting state and a termination region along a periphery of the active region. The semiconductor device is formed as follows. A first silicon region of a first conductivity type is formed extending to a first depth within a second silicon region of a second conductivity type, the first and second silicon regions forming a PN junction therebetween. At least one termination trench is formed in the termination region, the at least one termination trench extending into the second silicon region and being laterally spaced from the first silicon region. An insulating layer is formed lining the sidewalls and bottom of the at least one termination trench, and a conductive electrode is formed at least partially filling the at least one termination trench.

In accordance with yet another embodiment of the invention, a semiconductor power device includes an active region configured to conduct current when the semiconductor device is biased in a conducting state and a termination region along a periphery of the active region. The semiconductor device is formed as follows. A first silicon region of a first conductivity type is formed extending to a first depth within a second silicon region of a second conductivity type, the first and second silicon regions forming a PN junction therebetween. A portion of the second silicon region is recessed to below the first depth such that the recessed portion extends out to an edge of a die housing the semiconductor power device, the recessed portion forming a vertical wall at which the first silicon region terminates. A first conductive electrode is formed extending into the recessed portion and being insulated from the second silicon region.

The following detailed description and the accompanying drawings provide a better understanding of the nature and advantages of the present invention.

DETAILED DESCRIPTION OF THE INVENTION

In accordance with the invention, various cost-effective termination techniques disclosed herein can be incorporated in various types of power devices, and which integrate particularly well with trench gate FET technology.

Figure 2:
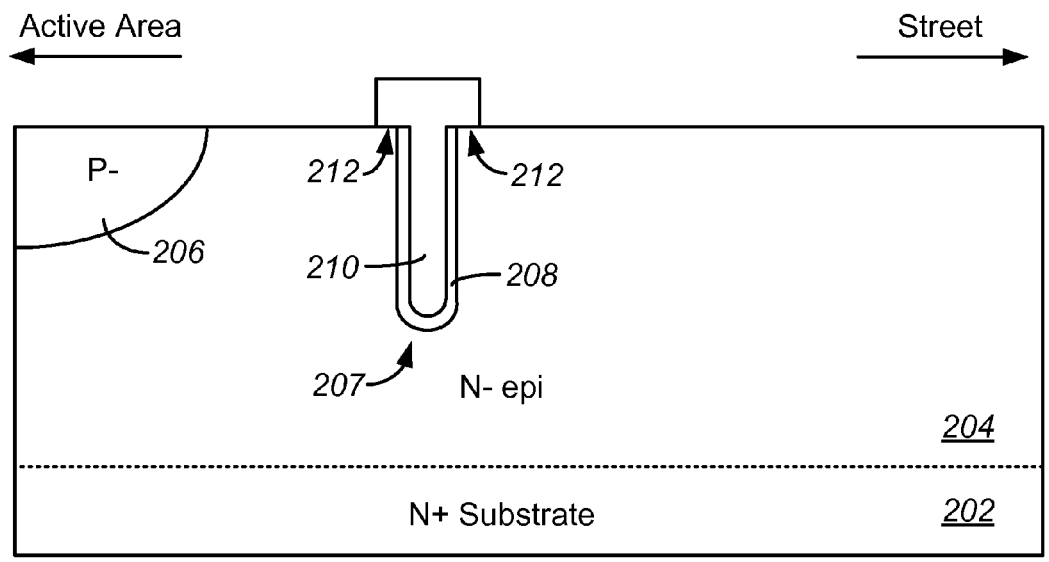
FIGS. 2-9 show simplified cross-section views of various trench field plate termination structures in accordance with embodiments of the invention.

FIG. 2 is a simplified cross section view illustrating a termination technique in accordance with an embodiment of the invention. An N-type epitaxial layer 204 extends over an N-type substrate 202. A trench field plate structure 207 extends into epitaxial layer 204 and surrounds the active area of the die. P-type diffusion region 206 represents the last blocking diffusion of the active region of the die. Trench field plate 207 includes an insulating layer 208 (e.g., comprising oxide) lining the trench sidewalls and bottom. Field plate 207 further includes P-type electrode 210 (e.g., comprising polysilicon or epitaxially grown silicon) filling the trench and extending out of the trench to electrically contact epitaxial layer 204 surface regions 212 adjacent the trench. In general, electrode 210 needs to be of a conductivity type opposite that of the silicon region it contacts so that electrode 210 can bias itself. In this manner, trench field plate 207 more effectively spreads the electric fields during device operation, thus achieving a high breakdown voltage.

In one embodiment, highly doped N-type regions flank each side of trench field plate 207 in order to provide a better contact between electrode 210 and N-type epitaxial layer 204. While FIG. 2 shows trench field plate 207 extending deeper than P-type junctions 206, the invention is not limited as such. Factors determining the optimum depth of trench field plate 207 include the thickness of dielectric layer 208 and the spacing between trench 207 and P-type region 206.

In one embodiment trench field plate 207 is formed as follows. A termination trench surrounding an active region of a power device is formed in epitaxial layer 204 using conventional silicon etch techniques. The trench is lined with an insulating layer 208 along its sidewalls and bottom using known techniques. An electrode 210 of opposite conductivity type to the epitaxial layer is formed using conventional photolithography and processing steps such that electrode 210 fills the trench and extends out to electrically contact adjacent surface regions of the epitaxial layer. In one embodiment, electrode 210 comprises P-type polysilicon formed using conventional poly deposition techniques. In another embodiment, electrode 210 is formed using conventional selective epitaxial growth (SEG) techniques.

Figure 1A:
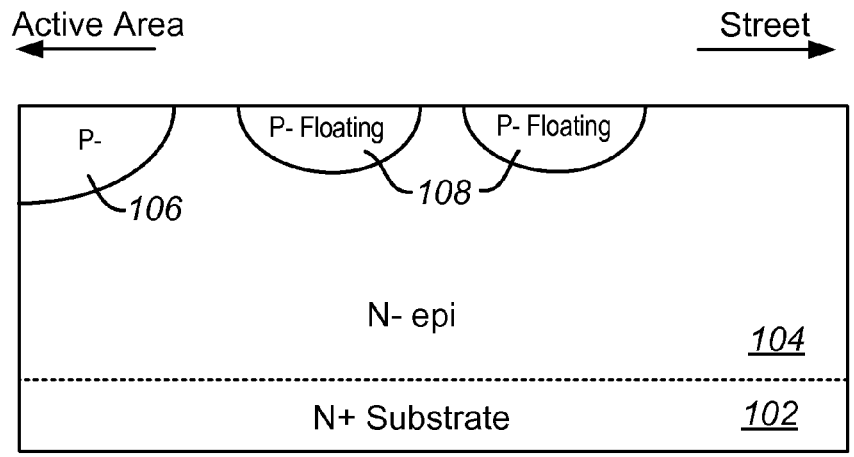
FIGS. 1A-1C show simplified cross-section views of three conventional termination structures.
Figure 1B:
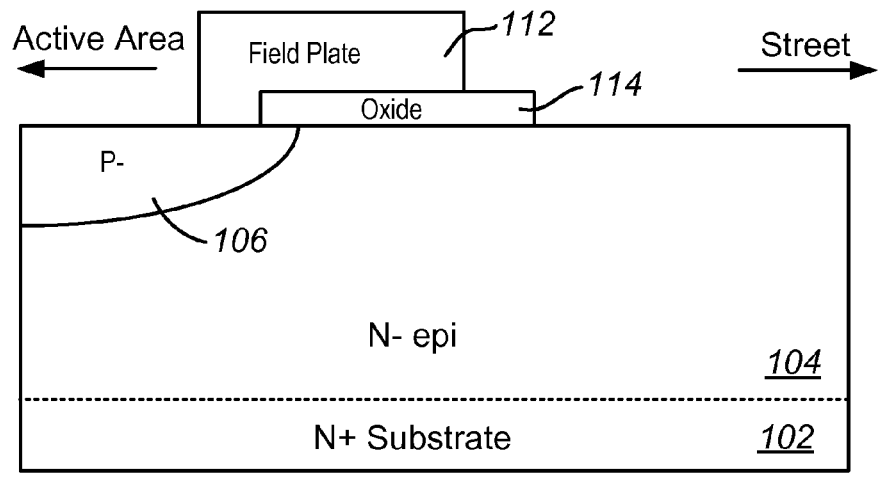
Figure 1C:
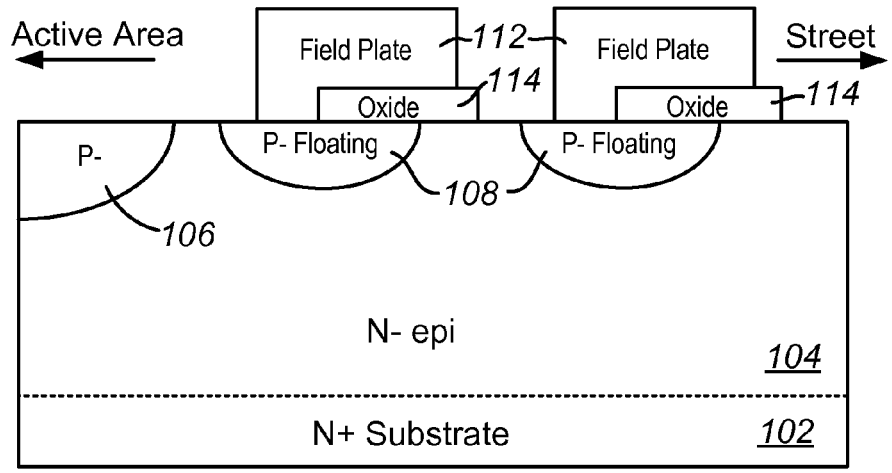

As can be seen, trench field plate 207 is simple to form and consumes far less silicon area than the conventional floating rings and planar field plate shown in FIGS. 1A-1C. In one embodiment, the termination technique in FIG. 2 is incorporated in a conventional trench gate MOSFET. In this embodiment, many of the same photolithography and processing steps for forming the trench gate structures in the active region are used to form trench field plate 207. Thus, a highly effective termination structure which consumes minimal silicon area and has minimal impact on the manufacturing process is formed.

Figure 3:
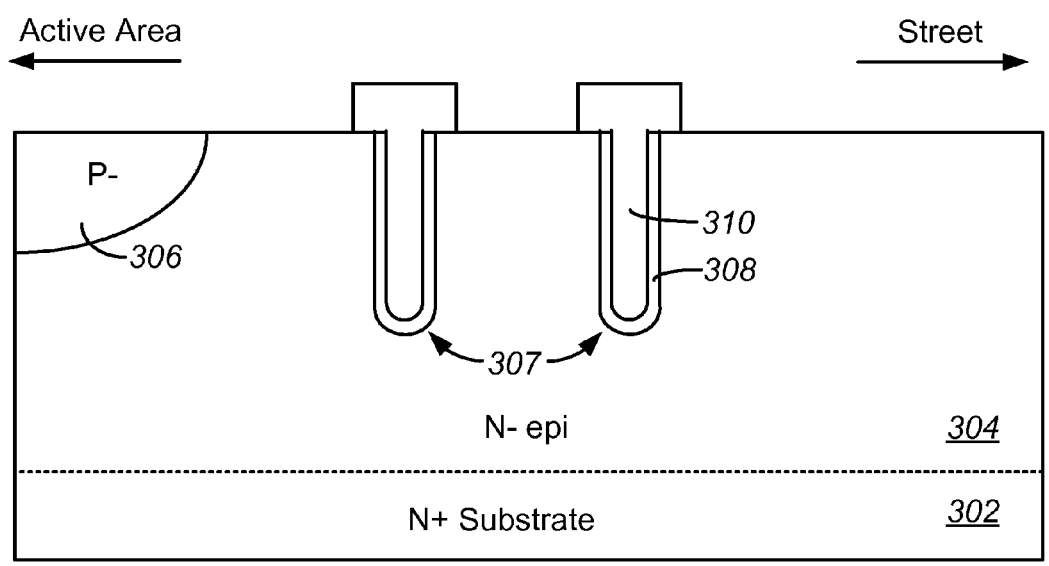

FIG. 3 illustrates a variation of the FIG. 2 embodiment wherein multiple trench field plates 307 are used to extend the depletion region further away from the transistor surface. An even higher breakdown voltage is thus obtained. While only two trench field plates are shown, more trench field plate terminations can be used. As shown in FIG. 3, an N-type epitaxial layer 304 extends over an N-type substrate 302. Trench field plate structures 307 extend into epitaxial layer 304. Each of the trench field plate structures 307 includes an insulating layer 308 (e.g., comprising oxide) lining the trench sidewalls and bottom. Each of the trench field plate structures also includes a P-type electrode 310 (e.g., comprising polysilicon or epitaxially grown silicon) filling the trench and extending out of the trench to allow electrical contact with a surface region of epitaxial layer 304. Also shown in FIG. 3, P-type diffusion region 306 provides for a last blocking diffusion of an active region of the die.

Figure 4:
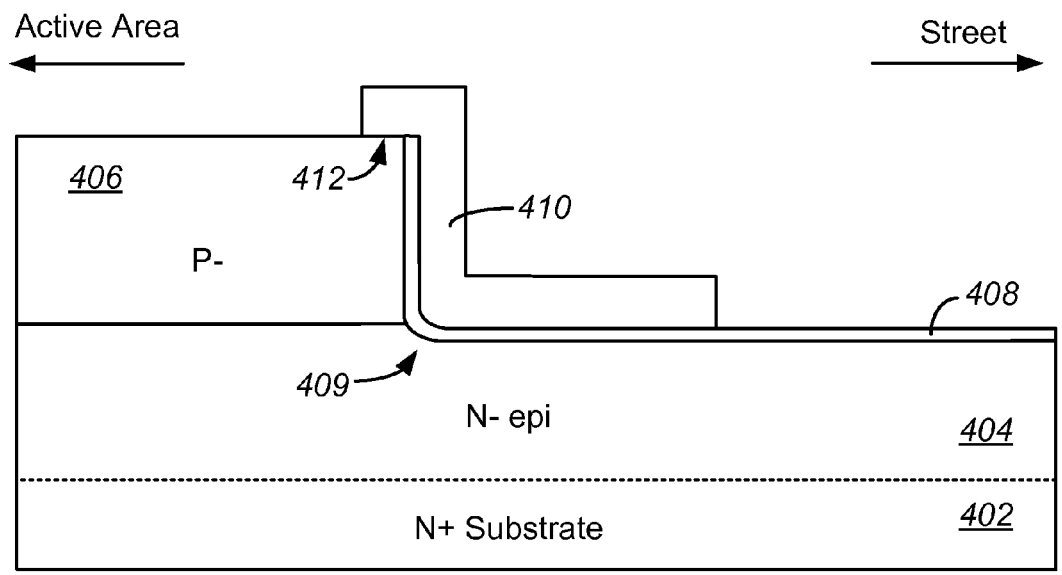

FIG. 4 shows a simplified cross-section view of another trench field plate termination structure 409 wherein a portion of epitaxial layer 406 is removed so that P-type region 406 terminates at a substantially vertically extending wall. The curvature of the P-type region as in, for example, P-type diffusion 306 in FIG. 3, is advantageously eliminated. As shown, the trench formed as a result of the silicon etch extends into the street (regions separating adjacent dice on a wafer), though it may also be formed so as to terminate before reaching the street. A trench field plate electrode 410 partially extends over and electrically contacts surface region 412 of P-type region 406. Field plate electrode 410 further extends vertically along the sidewall of floating region 406 and horizontally over the recessed surface of epitaxial layer 404. A dielectric layer 408 (e.g., comprising oxide) insulates field plate electrode 410 from epitaxial layer 404 which extends over substrate 402.

In one embodiment, the trench field plate structure 409 in FIG. 4 is formed as follows. After forming P-type region 406 in epitaxial layer 404 using conventional implant/drive in techniques, an outer portion of epitaxial layer 404 surrounding the active region is recessed to below the depth of P-type region 406 using conventional photolithography and silicon etch techniques. Insulating layer 408 is then formed using known techniques. Electrode 410 is then formed using conventional photolithography and processing steps such that electrode 410 partially extends over and electrically contacts P-type regions 406, steps down along the sidewall of P-type region 406, and extends over the recessed surface of epitaxial layer 404.

In one embodiment, electrode 410 comprises a heavily doped polysilicon or epitaxially grown silicon. In another embodiment, prior to forming electrode 410, a heavily doped P-type diffusion region is formed in P-type region 406 at the interface between P-type region 406 and field plate electrode 410 so as to lower the contact resistance between P-type region 406 and electrode 410. In another embodiment, P-type region 406 may be a floating region thereby enabling electrode 410 to bias itself. In this embodiment, electrode 410 and region 406 need to be of opposite conductivity type. In yet another embodiment, because the curvature of P-type diffusion region 406 is eliminated, diffusion region 406 need not be floating and may instead be an extended portion of the outer P-type well region of the active area.

Figure 5:
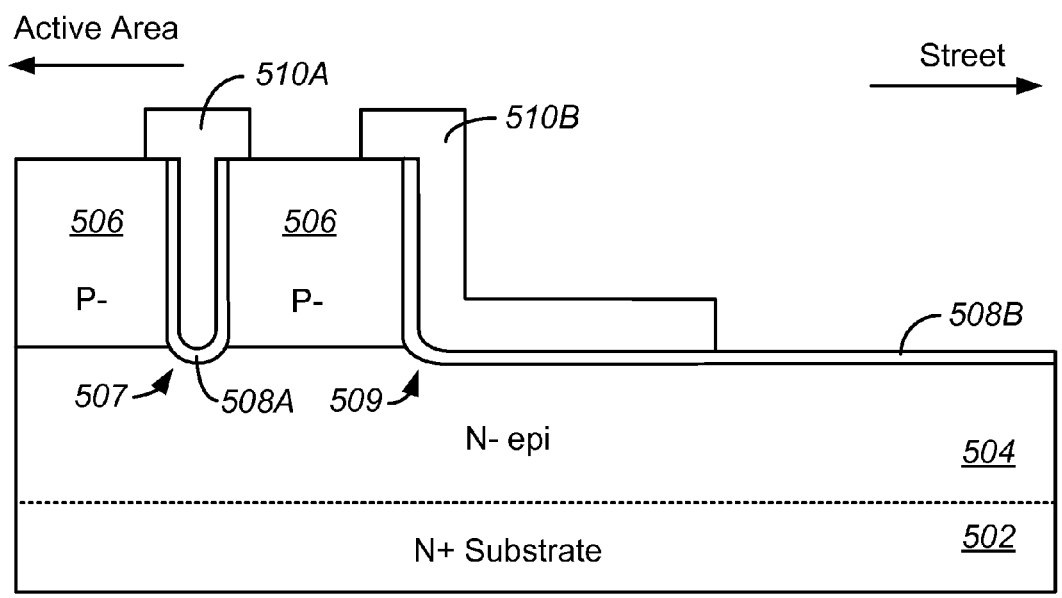

FIG. 5 illustrates an embodiment wherein the trench field plate termination techniques depicted by FIGS. 2 and 4 are combined to obtain an even higher breakdown voltage. As shown in FIG. 5, a first trench field plate 507 (which is similar in structure to those in FIGS. 2-3) extends through P-type region 506. Electrode 510A filling the trench extends out of the trench to contact P-type region 506. A second trench field plate 509 formed to the right of the first field plate 507 is similar in structure to that in FIG. 4. Trench field plate electrode 510B partially extends over and electrically contacts surface region of P-type region 506. Field plate electrode 510B further extends vertically along the sidewall of floating region 506 and horizontally over the recessed surface of epitaxial layer 504. A dielectric layer 508B (e.g., comprising oxide) insulates field plate electrode 510B from epitaxial layer 504 which extends over substrate 502. As in previous embodiments, heavily doped P-type diffusion regions may be formed at the interface between P-type region 506 and each of field plate electrodes 510A and 510B for purposes of reducing the contact resistance. In one embodiment, the termination structure in FIG. 5 is modified so that multiple trench field plate structures 507 extend through P-type region 506. P-type regions 506 may be allowed to float or biased, and electrodes 510A, 510B may be doped N-type or P-type depending on whether P-type regions 506 are biased or not and other factors.

Figure 6:
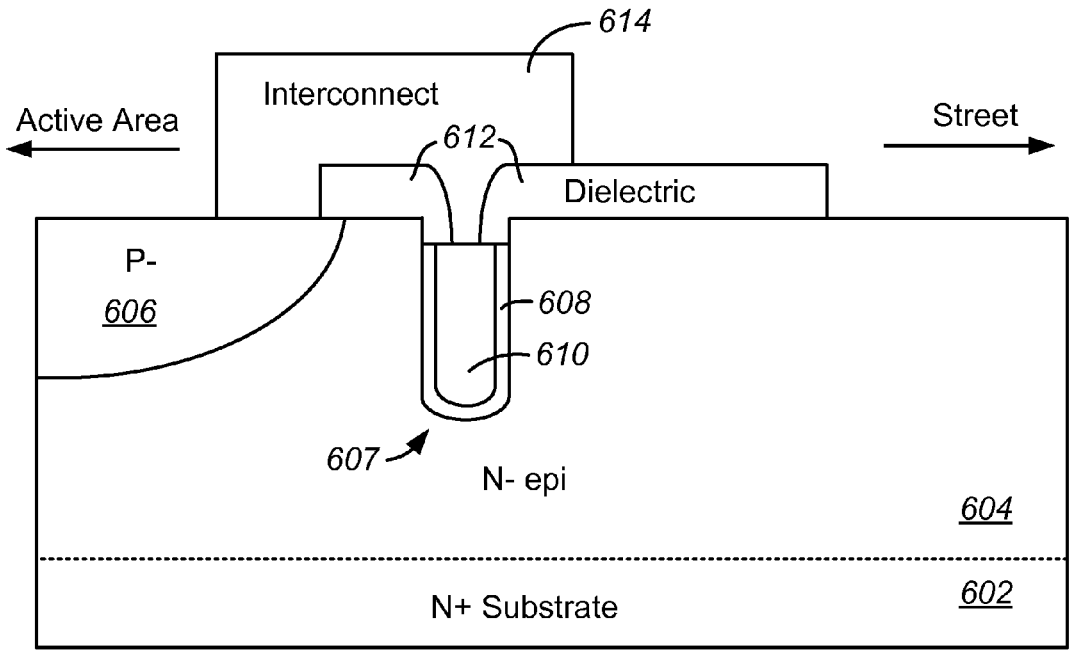

FIG. 6 shows a simplified cross section view of a termination structure in accordance with another embodiment of the invention. A P-type diffusion 606 formed in an epitaxial layer 604 is electrically connected to an electrode 610 of a trench field plate structure 607 also formed in epitaxial layer 604. Epitaxial layer 604 extends over an N type substrate 602. Field plate structure 607 includes a trench with an insulating layer 608 (e.g., comprising oxide) lining the trench sidewalls and bottom. An N-type or P-type electrode 610 (e.g., comprising polysilicon) partially fills the trench. An interconnect 614 electrically connects electrode 608 to P-type region 606. Interconnect 614 may comprise metal and/or doped polysilicon. A dielectric layer 612 forms a contact opening through which conductor 614 contacts trench electrode 610, and also serves to insulate conductor 614 from epitaxial layer 604. In one embodiment, a highly doped P-type region is formed in P-type region 606 at the interface between P-type region 606 and interconnect 614 for purposes of reducing the contact resistance. In another embodiment, multiple trench field plate structures 607 may be formed in epitaxial layer 604 to further improve the termination blocking capability.

In one embodiment, trench field plate 607 is formed as follows. A termination trench surrounding an active region of a power device is formed in epitaxial layer 604 using conventional silicon etch techniques. The termination trench is lined with an insulating layer 608 along its sidewalls and bottom using known techniques. A recessed polysilicon 610 is formed in the trench using conventional photolithography and processing steps. A dielectric layer 612 is formed to define a contact opening over the recessed polysilicon 610 using known techniques. A metal contact layer is then formed to contact polysilicon 610 through the contact opening and to contact floating region 606 using conventional methods.

In another embodiment, termination structure 607 is advantageously integrated in a trench gate power MOSFET device. Because termination structure 607 is, for the most part, structurally similar to the recessed trenched-gate in the active area of the device, the same processing steps for forming the gate trenches in the active region can be used to form termination structure 607. Termination structure 607 is very cost effective in that it occupies far less silicon area than prior art techniques and adds little to no additional processing steps. As in prior embodiments, P-type region 606 may be allowed to float or biased, and electrode 610 may be doped N-type or P-type depending on whether P-type region 606 is biased or not as well as other factors.

Figure 7:
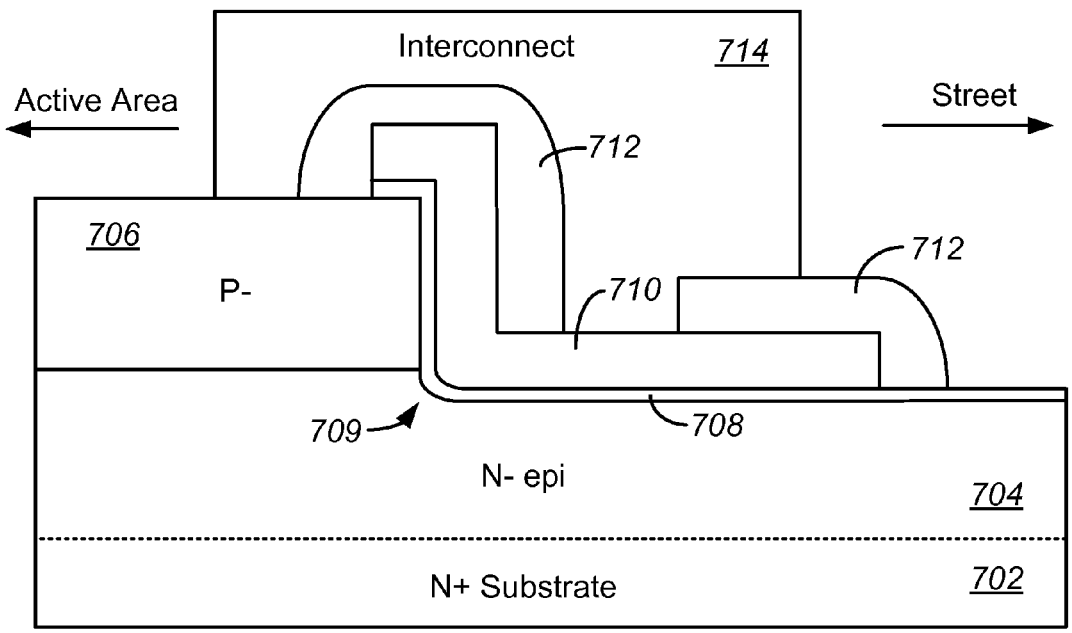

FIG. 7 shows a simplified cross-section view of yet another trench field plate termination structure 709 in accordance with an embodiment of the invention. Similar to the FIG. 4 embodiment, a portion of epitaxial layer 704 is recessed so that P-type region 706 terminates at a substantially vertically extending wall, thus eliminating the curvature of the last diffusion region. The trench field plate electrode 710 is also similar in structure to electrode 410 in FIG. 4 except that dielectric layer 708 in FIG. 7 extends underneath the portion of electrode 710 hanging over P-type region 706. Thus, insulating layer 708 fully insulates electrode 710 from P-type region 706, however interconnect 714 is used to electrically connect P-type region 706 to electrode 710. Dielectric layer 712 forms a contact opening through which conductor 714 contacts conductor 710. Epitaxial layer 604 extends over N type substrate 602. This embodiment achieves a better electrical contact between the trench field plate electrode and the P-type region than does the embodiment shown in FIG. 4.

The trench field plate structure 709 may be formed using the same process steps described above in connection with the FIG. 4 embodiment except that dielectric layer 708 needs to be formed so that it extends underneath the portion of electrode 710 which overhangs P-type region 706. Additional processing steps are required to form dielectric layer 712 so as to define a contact opening over electrode 710, and then form a metal contact layer 714 to contact electrode 710 through the contact opening and contact P-type region 706, using with known techniques.

In one embodiment, prior to forming metal layer 710, a heavily doped P-type diffusion region is formed in floating P-type region 706 at the interface between floating region 706 and metal layer 710 so as to obtain a lower contact resistance. In another embodiment, P-type region 706 may be a floating region thereby enabling electrode 710 to bias itself. In this embodiment, electrode 710 and region 706 need to be of opposite conductivity type. In yet another embodiment, because the curvature of P-type diffusion region 706 is eliminated, diffusion region 706 need not be floating and may instead be an extended portion of the outer P-type well region of the active area.

Figure 8:
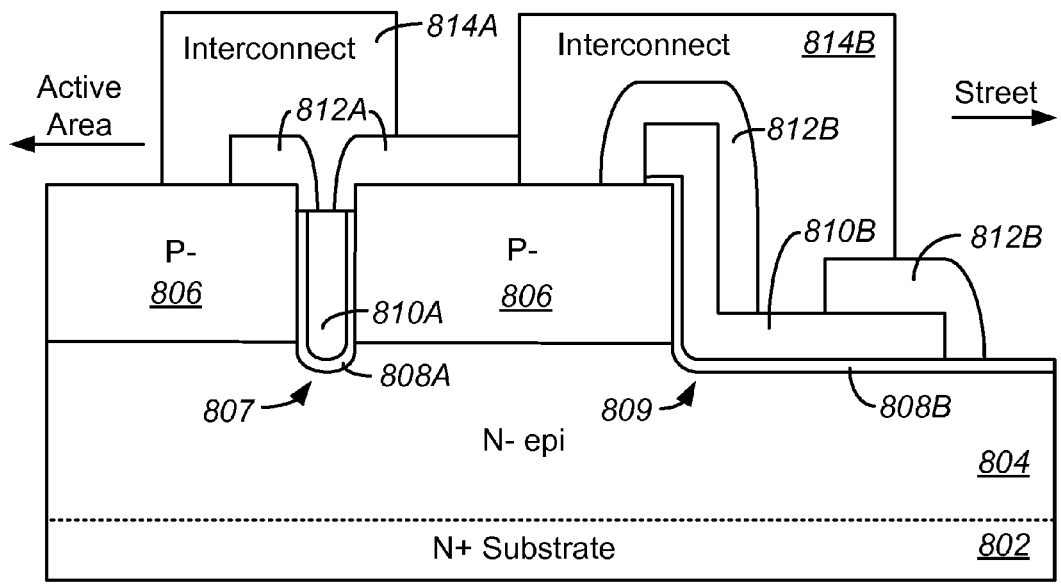

FIG. 8 illustrates an embodiment wherein the trench field plate termination techniques depicted by FIGS. 6 and 7 are combined to obtain an even higher breakdown voltage. As shown in FIG. 8, epitaxial layer 804 extends over N type substrate 802. A first trench field plate 807 (which is similar in structure to that in FIG. 6) extends through P-type region 806. First trench field plate structure 807 includes an insulating layer 808A (comprising, for example, silicon oxide) lining trench sidewalls and bottom. First trench field plate structure 807 also includes electrode 810A. Electrode 810A recessed in the trench is electrically connected to P-type region 806 via interconnect 814A. A dielectric layer 812A forms a contact opening through which interconnect 814A contacts electrode 810A. A second trench field plate 809 formed to the right of the first field plate 807 is similar in structure to that in FIG. 7. The second trench field plate includes electrode 810B and an insulator layer 808B extends underneath the portion of electrode 810B hanging over P-type region 806. Thus, insulating layer 808B fully insulates electrode 810B from P-type region 806. Interconnect 814B electrically connects P-type region 806 to electrode 810B. Dielectric layer 812B forms a contact opening through which interconnect 814B contacts electrode 810B. As in previous embodiments, heavily doped P-type diffusion regions may be formed in P-type regions 806 at the interface between P-type regions 806 and each of interconnects 814A and 814B for purposes of reducing the contact resistance. In one embodiment, the termination structure of FIG. 8 is modified so that multiple trench field plate structures 807 extend through floating P-type region 806. P-type regions 806 may be allowed to float or biased, and electrodes 810A, 810B may be doped N-type or P-type depending on whether P-type regions 806 are biased or not as well as other factors.

Figure 9:
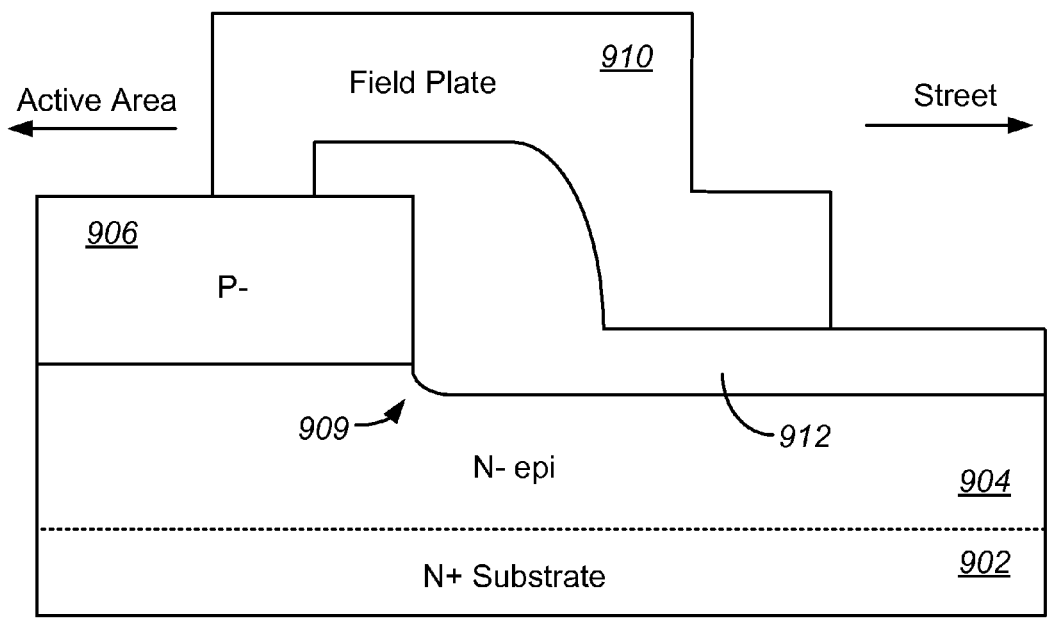

FIG. 9 shows yet another termination structure 909 which is similar to that in the FIG. 4 embodiment except that insulating layer 912 is thicker than insulating layer 408 in FIG. 4, and conductor 910 is from metal as opposed to polysilicon or SEG as in FIG. 4. As in the FIG. 4 embodiment, a portion of epitaxial layer 906 is recessed so that P-type region 906 terminates at a substantially vertically extending wall. The recessed silicon forms a trench which extends out to the street. Metal layer 910 electrically contacts a top surface of P-type region 906, and also extends into the silicon recess thus serving as a field plate.

In one embodiment, the trench field plate structure 909 is formed as follows. N type epitaxial layer 904 extends over substrate 902. After forming P-type region 906 in N type epitaxial layer 904 using conventional implant/drive in techniques, a portion of N type epitaxial layer 904 surrounding the active region is recessed to below the depth of P-type region 906 using conventional photolithography and silicon etch techniques. Insulating layer 912 is then formed using known techniques. Metal layer 910 is then formed using conventional photolithography and processing steps such that metal layer 910 extends over and contacts P-type regions 906, steps down and extends over the recessed portion of epitaxial layer 904.

In one embodiment, prior to forming electrode 910, a heavily doped P-type diffusion region is formed in floating P-type region 906 at the interface between floating region 906 and field plate electrode 910 so as to obtain a lower contact resistance. In another embodiment, P-type region 906 may be a floating region thereby enabling field plate 910 to bias itself. In this embodiment, electrode 910 and region 906 need to be of opposite conductivity type. In yet another embodiment, because the curvature of P-type diffusion region 906 is eliminated, diffusion region 906 need not be floating and may instead be an extended portion of the outer P-type well region of the active area.

Figure 10:
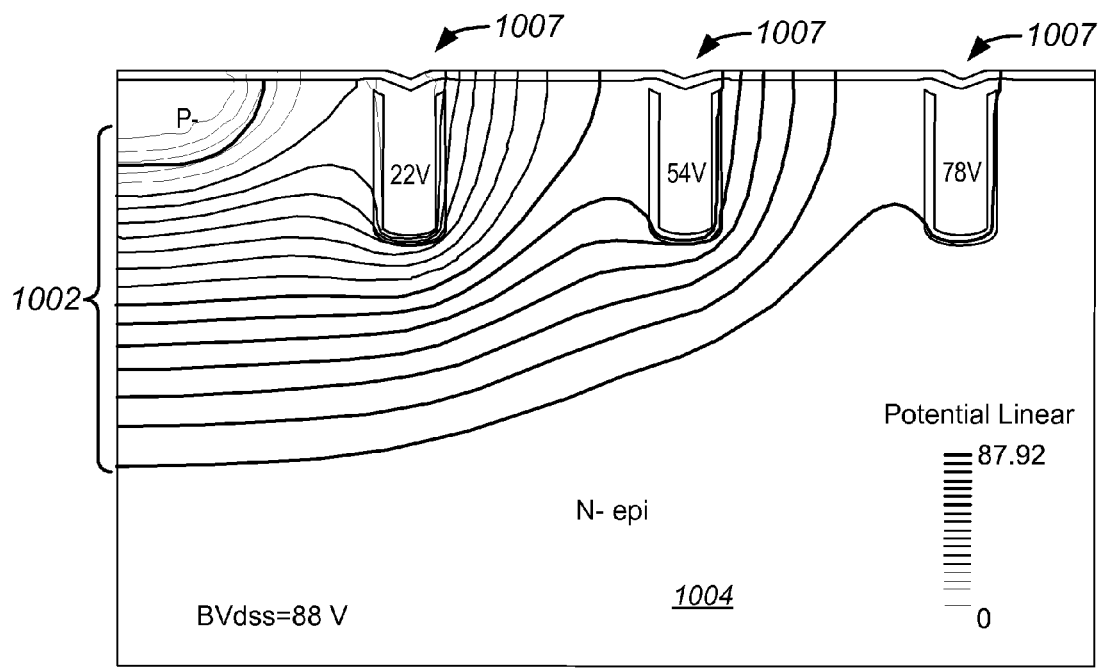
FIGS. 10 and 11 show simulation results for two different trench field plate termination structures.

FIG. 10 shows simulation result of a multiple P-type doped polysilicon trench field plate design which is similar in structure to the embodiment shown in FIG. 3. The different shadings of field lines 1002 represent the potential distribution with the darker lines representing higher potentials. The voltage value inside each of the three trench field plates represents the voltage acquired by the respective field plate electrodes. As can be seen, trench field plates 1007 operate to spread the potential lines 1002 thus achieving a more uniform electric field inside the device without inducing significant stress on the dielectric layers in the termination structure. As shown, potential lines 1002 extend out in epitaxial layer 1004.

Figure 11:
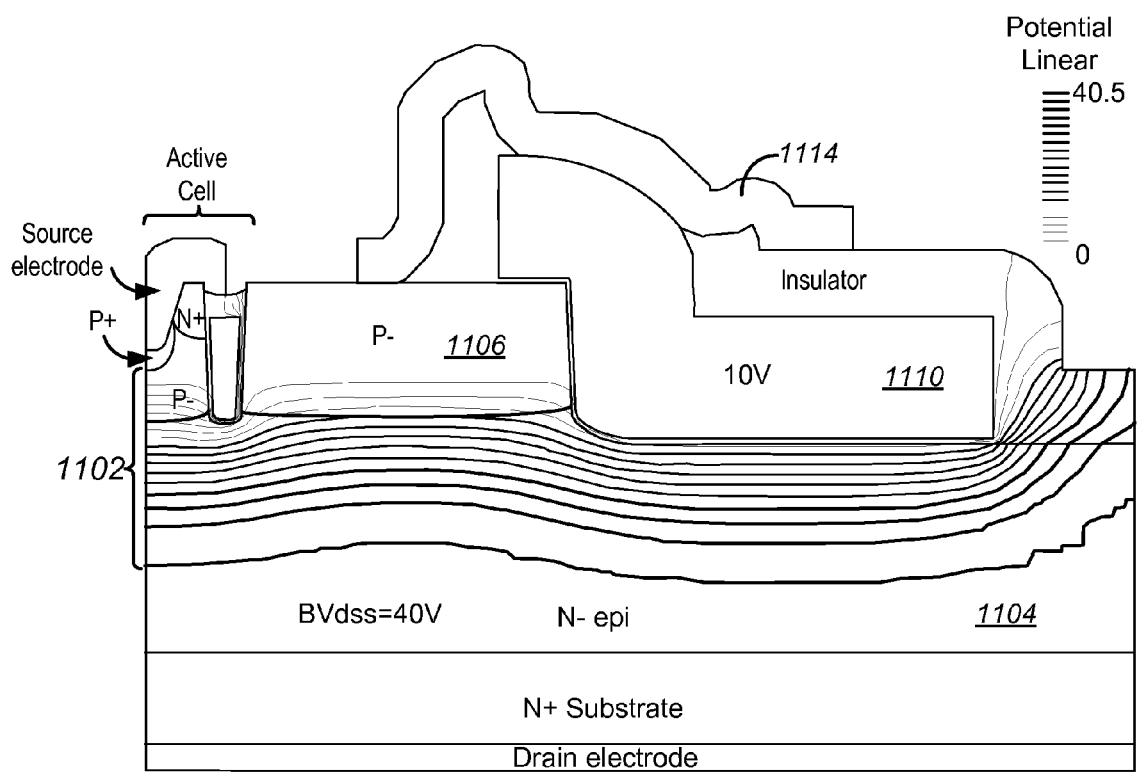

FIG. 11 shows another simulation result for a trench field plate structure which is similar to the embodiment shown in FIG. 7. Similar to the FIG. 7 embodiment, P-type region 1106 terminates at a vertically extending wall, polysilicon electrode 1110 extends over P-type region and into the silicon recess, and metal layer 1114 electrically connects P-type region 1106 to polysilicon electrode 1110. An active cell (the last one in the array) is shown on the left side of FIG. 11. As shown, the trench field plate structure in FIG. 11 operates to uniformly spread potential lines 1102 thus achieving a more uniform electric field without inducing any significant stress on the dielectric layers in the termination structure. As shown, potential lines 1102 extend out in epitaxial layer 1104.

One or more of the various trench termination structures and methods of forming the same described above, as well as any obvious variations thereof, may be advantageously combined with any one of the trench gate field effect transistors and methods of forming the same described in the above referenced commonly assigned U.S. patent application Ser. No. 11/026,276, filed Dec. 29, 2004, in order to form highly compact power devices with superior breakdown voltage characteristics in a cost effective manner.

While the present invention has been particularly shown and described with reference to exemplary embodiments thereof, it will be understood by those of ordinary skill in the art that various changes in form and details may be made without departing from the spirit and scope of the present invention as defined by the following claims.

What is claimed is:

1. A semiconductor power device comprising:
   an active region configured to conduct current when the semiconductor device is biased in a conducting state; and
   a termination region along a periphery of the active region, the termination region comprising:
      a first silicon region of a first conductivity type extending to a first depth within a second silicon region of a second conductivity type, the first and second silicon regions forming a PN junction therebetween, the second silicon region having a recessed portion extending below the first depth and out to an edge of a die housing the semiconductor power device, the recessed portion forming a vertical wall at which the first silicon region terminates; and
      a first conductive electrode extending into the recessed portion and being insulated from the second silicon region.

2. The semiconductor power device of claim 1 wherein the first conductive electrode forms a field plate which spreads the electric field in the second silicon region in a substantially uniform fashion when the PN junction is reverse biased.

3. The semiconductor power device of claim 1 wherein the first conductive electrode extends out of the recessed portion to directly contact a surface of the first silicon region.

4. The semiconductor power device of claim 3 further comprising a highly doped silicon region of the first conductivity type extending into the first silicon region, and being configured so as to reduce a contact resistance of the contact between the first conductive electrode and the first silicon region.

5. The semiconductor power device of claim 3 wherein the first silicon region is electrically unbiased so that it floats during operation.

6. The semiconductor power device of claim 3 wherein the semiconductor device is a MOSFET having a drain electrode and a source electrode, the first silicon region being electrically connected to the source terminal.

7. The semiconductor power device of claim 3 wherein the first conductive electrode comprises one of polysilicon and metal.

8. The semiconductor power device of claim 1 wherein the first conductive electrode is fully insulated from both the first and second silicon regions by an insulating layer, and an interconnect layer electrically connects the first conductive electrode to the first silicon region.

9. The semiconductor power device of claim 8 further comprising a highly doped silicon region of the first conductivity type extending into the first silicon region, and being configured so as to reduce a contact resistance of the contact between the interconnect layer and the first silicon region.

10. The semiconductor power device of claim 8 wherein the first silicon region is electrically unbiased so that it floats during operation.

11. The semiconductor power device of claim 8 wherein the semiconductor device is a MOSFET having a drain electrode and a source electrode, the first silicon region being electrically connected to the source terminal.

12. The semiconductor power device of claim 1 wherein the second silicon region is an epitaxial layer formed over a substrate.

13. The semiconductor power device of claim 1 wherein the first silicon region is electrically unbiased so that it floats during operation.

14. The semiconductor power device of claim 1 wherein the first conductive electrode comprises one of polysilicon and metal.

15. The semiconductor power device of claim 1 wherein the termination region further comprises:
a termination trench extending into the first silicon region, and being laterally spaced from the vertical wall;
an insulating layer lining the sidewalls and bottom of the termination trench; and
a second conductive electrode at least partially filling the termination trench.

16. The semiconductor power device of claim 15 wherein the first and second conductive electrodes respectively extend out of the recessed portion and the termination trench to directly contact a surface of the first silicon region.

17. The semiconductor power device of claim 15 wherein the first silicon region is electrically unbiased so that it floats during operation.

18. The semiconductor power device of claim 15 wherein the semiconductor device is a MOSFET having a drain electrode and a source electrode, the first silicon region being electrically connected to the source terminal.

19. The semiconductor power device of claim 15 wherein the first and second conductive electrodes are fully insulated from both the first and second silicon regions by an insulating layer, and an interconnect layer electrically connects the first and second conductive electrodes to the first silicon region.

20. A method of forming a semiconductor power device having an active region configured to conduct current when the semiconductor device is biased in a conducting state and a termination region along a periphery of the active region, the method comprising:
forming a first silicon region of a first conductivity type extending to a first depth within a second silicon region of a second conductivity type, the first and second silicon regions forming a PN junction therebetween;
forming a first silicon region of a first conductivity type extending to a first depth within a second silicon region of a second conductivity type, the first and second silicon regions forming a PN junction therebetween,
recessing a portion of the second silicon region to below the first depth such that the recessed portion extends out to an edge of a die housing the semiconductor power device, the recessed portion forming a vertical wall at which the first silicon region terminates; and
forming a first conductive electrode extending into the recessed portion and being insulated from the second silicon region.

21. The method of claim 20 wherein the step of forming a first conductive electrode is carried out so that the first conductive electrode extends out of the recessed portion to directly contact a surface of the first silicon region.

22. The method of claim 20 wherein the first conductive electrode comprises one of polysilicon and metal.

23. The method of claim 20 further comprising:
forming an insulating layer so as to fully insulate the first conductive electrode from both the first and second silicon regions; and
forming an interconnect layer electrically connecting the first conductive electrode to the first silicon region.

24. The method of claim 20 further comprising:
forming at least one termination trench in the termination region, the at least one termination trench extending into the first silicon region and being laterally spaced from the vertical wall; and
simultaneously with the step of forming a first conductive electrode, forming a second conductive electrode at least partially filling the at least one termination trench.

25. The method of claim 24 wherein the first and second conductive electrodes respectively extend out of the recessed portion and the termination trench to directly contact a surface of the first silicon region.

26. The method of claim 24 further comprising:
forming an insulating layer so as to fully insulate the first and second conductive electrodes from both the first and second silicon regions; and
forming an interconnect layer electrically connecting the first and second conductive electrodes to the first silicon region.

* * * * *